(12) United States Patent
Liu et al.

(10) Patent No.: US 10,700,013 B2
(45) Date of Patent: Jun. 30, 2020

(54) IC WAFER FOR IDENTIFICATION OF CIRCUIT DIES AFTER DICING

(71) Applicant: GLOBALFOUNDRIES INC., Grand Cayman (KY)

(72) Inventors: Wen Liu, South Burlington, VT (US); Sebastian T. Ventrone, South Burlington, VT (US); Adam C. Smith, Essex Junction, VT (US); Janice M. Adams, Jericho, VT (US); Nazmul Habib, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 9 days.

(21) Appl. No.: 15/867,118

(22) Filed: Jan. 10, 2018

(65) Prior Publication Data

US 2019/0214348 A1    Jul. 11, 2019

(51) Int. Cl.
*H01L 23/544* (2006.01)
*H01L 21/78* (2006.01)
*H01L 21/66* (2006.01)
*H01L 23/522* (2006.01)
*H01L 23/528* (2006.01)

(52) U.S. Cl.
CPC ............ *H01L 23/544* (2013.01); *H01L 21/78* (2013.01); *H01L 22/12* (2013.01); *H01L 22/20* (2013.01); *H01L 22/32* (2013.01); *H01L 23/528* (2013.01); *H01L 23/5226* (2013.01); *H01L 2223/5442* (2013.01); *H01L 2223/5448* (2013.01); *H01L 2223/54433* (2013.01)

(58) Field of Classification Search
CPC . H01L 23/544; H01L 23/528; H01L 23/5226; H01L 23/522; H01L 2223/5448; H01L 2223/54433; H01L 2223/544; H01L 2223/5442; H01L 22/12; H01L 22/30; H01L 22/32; H01L 22/34; H01L 21/78
See application file for complete search history.

(56) References Cited

U.S. PATENT DOCUMENTS

| 6,933,523 | B2 * | 8/2005 | Sheck ................... H01L 23/544 257/283 |
| 7,027,143 | B1 | 4/2006 | Stokowski et al. |
| 7,348,682 | B2 * | 3/2008 | Brambilla ............ H01L 23/544 257/758 |
| 7,769,225 | B2 | 8/2010 | Kekare et al. |
| 8,298,920 | B2 * | 10/2012 | Aoki ..................... H01L 23/544 257/E23.179 |

(Continued)

*Primary Examiner* — Michael M Trinh
(74) *Attorney, Agent, or Firm* — Anthony Canale; Hoffman Warnick LLC

(57) ABSTRACT

Aspects of the present disclosure provide an integrated circuit (IC) wafer having a plurality of circuit dies each bounded by a set of scribe lines. The IC structure includes: a plurality of reference features each respectively positioned in a first layer of one of the plurality of circuit dies. The reference feature of each circuit die is equidistant from a respective set of scribe lines for the circuit die, and a plurality of identification features each positioned in a second layer of one of the plurality of circuit dies. The reference feature of each circuit die has a distinct offset vector indicative of a positional difference between the identification feature for the circuit die and the reference feature for the circuit die, relative to the identification feature of each other circuit die.

7 Claims, 9 Drawing Sheets

(56) References Cited

U.S. PATENT DOCUMENTS

| | | |
|---|---|---|
| 9,224,694 B2 * | 12/2015 | Pagani .................. H01L 23/544 |
| 2005/0095509 A1 | 5/2005 | Zhang et al. |
| 2006/0210144 A1 | 9/2006 | Yamaguchi et al. |
| 2011/0276935 A1 | 11/2011 | Fouquet et al. |

* cited by examiner

IC WAFER FOR IDENTIFICATION OF CIRCUIT DIES AFTER DICING

BACKGROUND

The subject matter disclosed herein relates to integrated circuit (IC) wafer structures and methods for identifying the location of a particular die after dicing of the wafer. More specifically, aspects of the invention relate to structures which include identification features for indicating the original location of a circuit die on an IC wafer, methods of forming such features, and methods of using such features.

Integrated circuit manufacturing includes fabricating the structure of multiple circuit dies together on a single semiconductor wafer. After forming one semiconductor wafer, the wafer may be split into multiple circuit dies. Wafer dicing refers to the process of dicing (i.e., splitting) the single semiconductor wafer into a plurality of circuit dies for conversion into end products. The dicing of a wafer includes defining a set of scribe lines, alternatively known as kerf lines, for separating various regions of the wafer, such that each region includes the structure of a particular die bounded by a corresponding set of scribe lines. The dicing process may include the mechanical splitting of the wafer, e.g., by laser cutting and/or other procedures for separating semiconductor material and elements formed therein into smaller pieces.

One underlying characteristic of wafer dicing is the loss of materials included at or near the set of scribe lines. These materials and regions may be known as the IC wafer's kerf region. Conventional testing methods may include forming various structures, features, etc., in the kerf region of an IC wafer to determine the quality of a wafer before it is diced. IC wafers that pass this stage of testing will then be diced, and the test structures included in the kerf regions of the wafer will be removed or otherwise disconnected from functional components of the individual circuit dies. Predice testing of an IC wafer may not fully account for post-deployment characteristics of a particular product, e.g., functional failures of a fabricated unit. After a wafer is diced, the various wafer dies may be intermixed and/or distributed to different customers or sites without regard to which wafer, or portion of a wafer, may have been used to produce each circuit die. Conventional testing may be limited to evaluating the characteristics of the entire wafer prior to dicing, or examination of particular units after manufacture, without any ability to associate an end product or batch of products with a particular portion of the original wafer.

SUMMARY

A first aspect of the present disclosure provides an integrated circuit (IC) wafer having a plurality of circuit dies each bounded by a set of scribe lines, the IC structure including: a plurality of reference features each respectively positioned in a first layer of one of the plurality of circuit dies, wherein the reference feature of each circuit die is equidistant from a respective set of scribe lines for the circuit die, and a plurality of identification features each positioned in a second layer of one of the plurality of circuit dies, the reference feature of each circuit die having a distinct offset vector indicative of a positional difference between the identification feature for the circuit die and the reference feature for the circuit die, relative to the identification feature of each other circuit die.

A second aspect of the present disclosure provides a method for manufacturing integrated circuit (IC) structures, the method including: forming a plurality of circuit dies in an IC wafer, each of the plurality of circuit dies being bounded by a set of scribe lines, wherein forming the plurality of circuit dies further includes: forming a reference feature in a first layer of each of the plurality of circuit dies, wherein the reference feature of each circuit die is equidistant from a respective set of scribe lines for the circuit die, and forming an identification feature in a second layer of each of the plurality of circuit dies, the identification feature having an offset vector indicative of a positional difference between the identification feature for the circuit die and the reference feature for the circuit die, wherein each of the plurality of circuit dies in the IC wafer includes a distinct offset vector for the identification feature relative to the identification feature of each other circuit die.

A third aspect of the present disclosure provides a method for identifying circuit dies, the method including: selecting one of a plurality of circuit dies for analysis, the plurality of circuit dies being diced from an IC wafer; measuring an offset vector between an identification feature of a first layer in the selected circuit die and a reference feature of a second layer in the selected circuit die, wherein each of the plurality of circuit dies includes the reference feature at a same location, and wherein each of the plurality of circuit dies includes a distinct offset vector indicative of a positional difference between the identification feature and the reference feature for one of the plurality of circuit dies, relative to the identification feature of each other circuit die; comparing the measured offset vector for the selected circuit die with an index of offset vectors for the IC wafer; and identifying a location of the selected circuit die in the plurality of circuit dies of the IC wafer, based on the comparing of the measured offset vector with the index of offset vectors for the IC wafer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
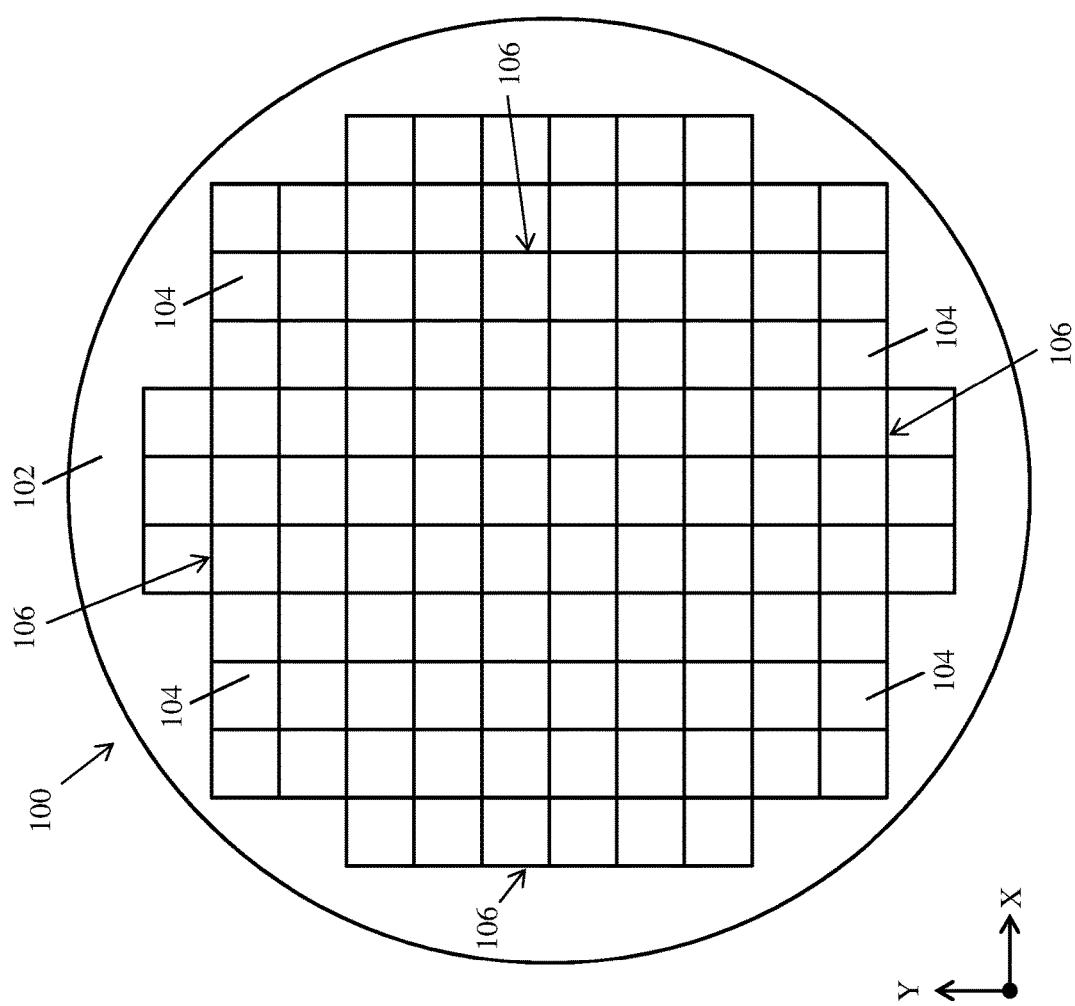
FIG. 1 provides a plan view in plane X-Y of an integrated circuit (IC) wafer and circuit dies according to embodiments of the disclosure.

Referring to FIG. 1, embodiments of the disclosure provide an integrated circuit (IC) wafer 100 structured for the identifying of individual circuit dies after the dicing of IC wafer 100. Technical challenges associated with the manufacture of IC product units include the tracing of functional failing products (i.e., products which operate in a manner other than intended) to specific regions of an IC wafer from which the products were manufactured. Functional failing products may include, e.g., defective chips and/or chips with functional failures. Conventional testing may be limited to evaluating the characteristics of the entire wafer prior to dicing, or examination of particular units after manufacture, without any ability to associate an end product or batch of products with a particular portion of the original wafer. To provide a more comprehensive model of quality management for IC product units, embodiments of IC wafer 100 discussed herein may allow users and/or manufacturers to identify a particular region of IC wafer 100 where individual dies, products, etc., originated before dicing occurred.

As shown in FIG. 1, IC wafer 100 (depicted via plan view in plane X-Y) may include a body 102, e.g., one or more semiconductor materials, dielectric materials, conductive materials, manufactured to include the device architecture of several products. Body 102 more specifically may include multiple vertically separated layers therein, with at least two of those layers being separately identified herein as first and second layers (e.g., layers L1, L2 of FIG. 5). The various portions of IC wafer 100 to be separated into distinct products or groups of products may be identified as circuit dies 104 to be separated into individual units. Each circuit die 104 may be laterally separated from other circuit dies 104 on IC wafer 100 by a set of scribe lines 106 indicating the specific locations where body 102 of IC wafer 100 will be diced in subsequent processing. Scribe liens 106 may take the form of grooves formed within IC wafer 100, and thus may be visible to an observer in some instances. As shown, scribe lines 106 may be arranged in the shape of a grid on body 102, such that each circuit die 104 covers a uniform surface area on body 102. Non-rectangular portions of body 102 may be positioned outside scribe lines 106.

The various regions and components of IC wafer 100 may have distinct roles before and after IC wafer 100 is separated into individual circuit dies. IC wafer 100 may be configured for dicing via one or more mechanical instruments (e.g., dicing blades), and/or other currently known or later developed instruments such as laser dicing tools, etc. Prior to dicing, portions of body 102 located outside of scribe lines 106 may not include functional features of a product therein, and instead may include one or more test structures configured to analyze IC wafer 100 before dicing occurs. Thus, any materials used for testing of IC wafer 100 located outside scribe lines 106 may have no significant use after dicing concludes. As also noted above, each circuit die 104 may also include sets of metal wires, vias, device components, dielectric materials, etc., therein, though such components are omitted from the depiction of IC wafer 100 in FIG. 1 solely for clarity of illustration. Such components in each circuit die 104 are conventionally structured only to yield the structural and operational features of each device formed from IC wafer 100.

Figure 2:
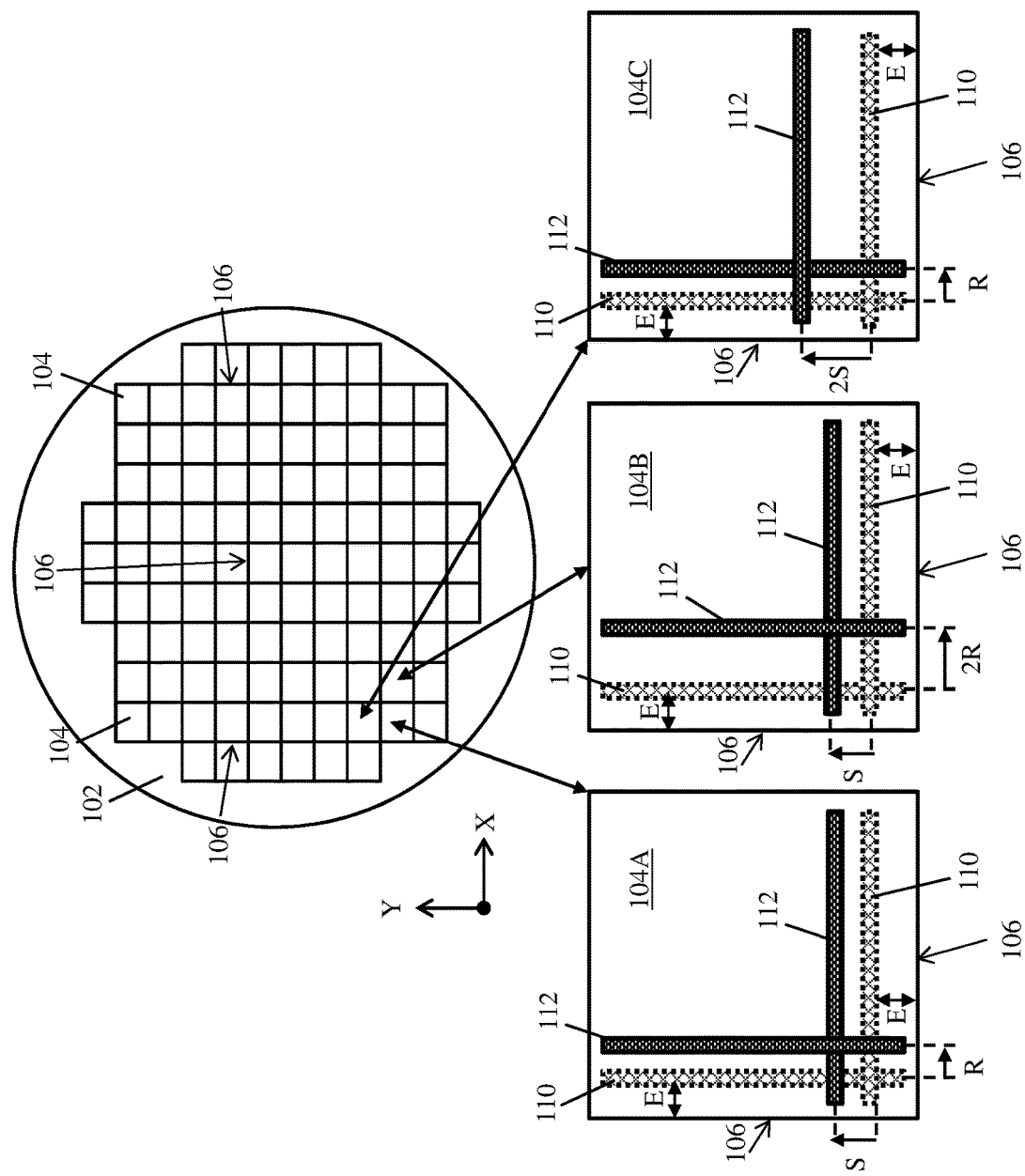
FIG. 2 provides a plan view in plane X-Y of the IC wafer and magnified views of three circuit dies according to embodiments of the disclosure.

Turning now to FIG. 2, IC wafer 100 is shown with magnified views of three circuit dies 104 (identified separately as 104A, 104B, 104C) to illustrate features of IC wafer 100 in various embodiments. Each circuit die 104 may include, e.g., one or more reference features 110 positioned in a first layer of a respective circuit die 104. As shown in each magnified view of circuit dies 104A, 104B, 104C, reference features 110 may be equidistant from one of a respective set of scribe lines 106 for each circuit die 104. To illustrate the equidistant separation each reference feature 110 and each corresponding scribe line 106, a separation distance E illustrates the same positional difference between each reference feature 100 and each scribe line 106. Reference feature 110 may be composed of any material capable of being structurally identified from the remainder of circuit die 104 and/or components therein. For example, reference feature 110 may include one or more light-reflecting materials capable of detection within the structure of circuit die 104 before or after dicing occurs.

In various embodiments, reference feature(s) 110 may be composed of a metal wire, an insulative material (e.g., one or more photolithographic masks), and/or other components distinct from other materials included within circuit die 104. Furthermore, reference features 110 may be distinct and/or other structurally disconnected from other portions of circuit die 104 for providing the operational structure and/or features of a particular product, despite being formed within a functional region of one circuit die 104. Two reference features 110 are shown in each circuit die 104 for the sake of example, and it is understood that any desired number of reference features 110 may be formed therein. Reference features 110 may exhibit an identical appearance in each circuit die 104, regardless of which individual circuit die (e.g., circuit die 104A, 104B, 104C, etc.) is under analysis. Reference feature(s) 110 may be positioned below an uppermost terminal layer of circuit die 104, and thus each reference feature 110 is depicted with phantom lines in each magnified view of FIG. 2.

Additional structures may be configured to identify the location of each circuit die 104 on IC wafer 100. Reference features 110 are shown to have the same position in each circuit die 104. To provide an embedded form of identification, each circuit die 104 may include one or more identification features 112 positioned in a second (i.e., different) layer as compared to the layer where reference features 110 appear. Two identification features 112 are shown in each circuit die 104 for the sake of example, and it is understood that any desired number of identification features 112 may be formed therein. To emphasize the location of identification feature(s) 112 as being in a different layer from reference feature(s) 110, identification features 112 are illustrated with different cross-hatching in circuit dies 104A, 104B, 104C. Identification feature(s) 112 may each be formed from the same or similar material as reference feature(s) 110, e.g., a metal wire, insulator (e.g., one or more masking materials), reflective films, and/or other components capable of being distinguished from other materials in each circuit die 104.

The position of identification feature(s) 112 in embodiments of the disclosure varies across each circuit die 104, thereby causing identification feature(s) 112 to be different in each circuit die 104. The varying position of identification feature(s) 112 in each circuit die 104 can be expressed in terms of an offset vector from reference feature(s) 110, due to the uniform location of reference feature(s) 110 in each circuit die 104. The offset vector may be expressed as a vector or vector sum indicating the positional difference between two locations (i.e., the location of reference feature(s) 110) and the location of identification feature(s) 112). Magnified circuit dies 104A, 104B, 104C illustrate how identification feature(s) 112 may distinguish between individual circuit dies 104A, 104B, 104C. The offset vector for identification feature(s) 112 may be expressed in terms of its magnitude and direction. The magnitude may correspond to an amount of separation between identification feature(s) 112 and corresponding reference feature(s) 110. The direction may correspond to one of several possible paths of separation between feature(s) 110, 112, e.g., latitudinal and/or longitudinal directions. In the example of FIG. 2, the offset vector for each set of identification feature(s) 112 may be expressed as the sum of a latitudinal offset between one reference feature 110 and one identification feature 112, and a longitudinal offset between the other reference feature 110 and other identification feature 112. Beginning with circuit die 104A, longitudinal-oriented identification feature 112 may be laterally separated from longitudinal-oriented reference feature 110 by a distance vector R (e.g., 100 micrometers (µm)) along the X-axis. Circuit die 104A may also include latitudinal-oriented identification feature 112 separated from latitudinal-oriented reference feature 110 by a distance vector S (e.g., 100 micrometers (µm)) along Y-axis. Thus, the offset vector between identification features 112 and reference features 110 of circuit die 104 may be expressed as the sum of distance vectors R and S. In this case, the offset vector for identification features 112 of circuit die 104A may not account for any vertical separation between the different layers of IC wafer 100 where reference features 110 and identification features 112 appear.

The positional difference between identification feature 112 and reference feature 110 in each circuit die 104 may be unique to one circuit die 104 of IC wafer 100. The summed offset vector (e.g., latitudinal vector R plus longitudinal vector S) for features 110, 112 in circuit die 104A may be specific to only circuit die 104A, regardless of whether its components vector R or vector S appear individually in another circuit die 104. For instance, in circuit die 104B, the offset vector between identification and reference features 112, 110 may be the sum of vector 2R (e.g., twice vector R, or approximately 200 µm, along X-axis) in the latitudinal direction, and vector S (e.g., approximately 100 µm) along Y-axis in the longitudinal direction. In circuit die 104C, the offset vector between identification and reference features 112, 110 may be the sum of vector R (approximately 100 µm) along X-axis in the latitudinal direction and vector 2S (e.g., twice vector S, or approximately 200 µm, along Y-axis) in the longitudinal direction. The resulting vector may preserve the latitudinal or longitudinal orientation of its component vectors, e.g., by being expressed as a resultant vector having a corresponding angle relative to X or Y axis.

Using circuit die 104C as an example, the offset vector for identification features 112 may be converted from vectors R and 2S into a single vector having a magnitude of approximately 220 µm and an angle of approximately 63 degrees relative to X-axis, via Euclidean geometry. In other cases, the offset vectors may be computed and expressed in terms of their component vectors, rather than a resultant vector. Although circuit dies 104A and 104B share a longitudinal component (vector S) in their respective offset vectors, the total offset vector is different in each circuit die. Similarly, circuit dies 104A, 104C also have distinct offset vectors despite sharing a latitudinal component (vector R) in their respective offset vectors.

Figure 3:
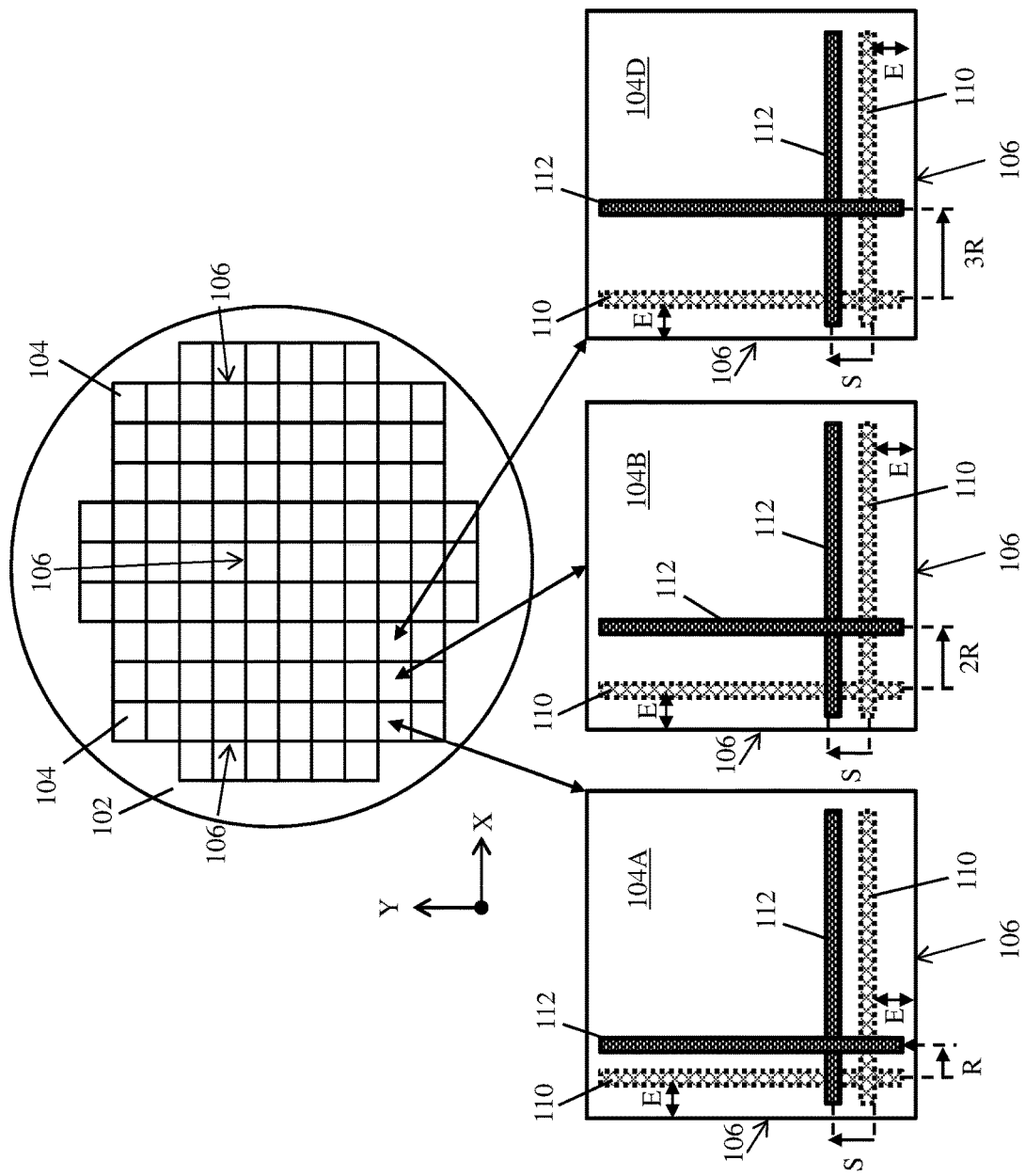
FIG. 3 provides a plan view in plane X-Y of the IC wafer and magnified views of a different group of circuit dies according to embodiments of the disclosure.

Turning to FIG. 3, embodiments of IC wafer 100 can be structured such that differences in the offset vector for each circuit die 104 follow a specific pattern. That is, identification features 112 in successive circuit dies 104 along one axis may be structured to follow a coordinate system. To illustrate this feature, another circuit die 104D is magnified together with circuit dies 104A, 104B. As shown, each circuit die 104A, 104B, 104D is positioned along a shared axis in the longitudinal direction. Thus, the offset vector between features 110, 112 in each circuit die 104A, 104B, 104D may include a same longitudinal component (i.e., vector S in the Y direction) but different latitudinal components (i.e., vectors R, 2R, 3R for regions 104A, 104B, 104D, respectively). In this case, each latitudinal vector may increase by a predetermined multiple (e.g., approximately 100 µm) at each successive circuit die along the shared axis. Thus, according to this example, the offset vector for features 110, 112 in circuit die 104B may have twice the latitudinal offset distance as the offset vector for features 110, 112 in circuit die 104A. In the same example, the offset vector for features 110, 112 in circuit die 104D may have three times the latitudinal offset distance as the offset vector for features 110, 112, in circuit die 104A. The amount of change thus may be the same for each successive circuit die 104 in IC wafer 100 along a shared latitudinal or longitudinal axis.

Figure 4:
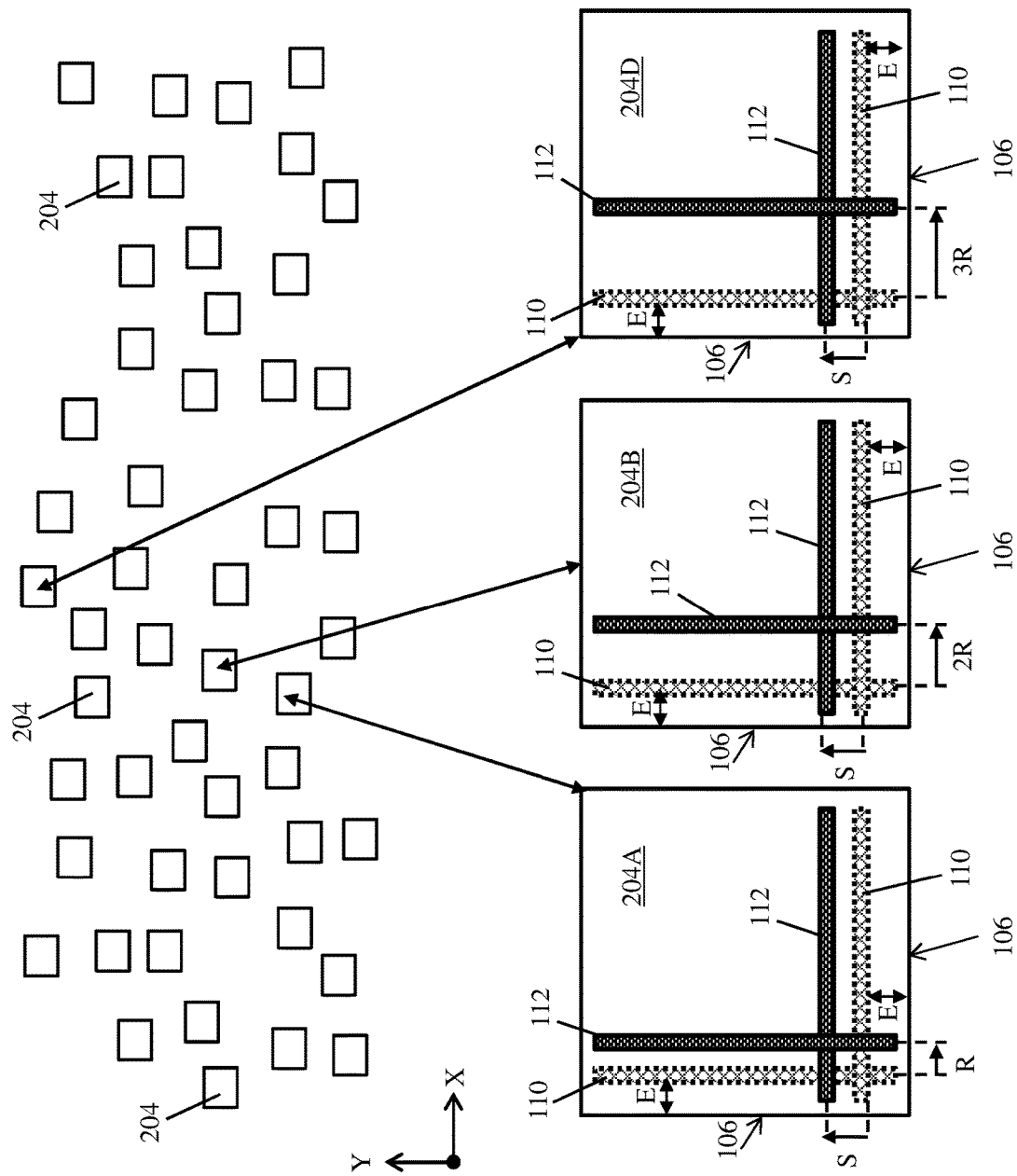
FIG. 4 provides a plan view in plane X-Y of a diced IC wafer and magnified views of three circuit dies according to embodiments of the disclosure.

FIG. 4 illustrates how features 110, 112 may identify the initial location of a particular structure on IC wafer 100 (FIGS. 1-3), even after IC wafer 100 has been diced into individual pieces. FIG. 4 shows a plurality of circuit dies 204, each of which may have been previously diced from a single IC wafer (e.g., IC wafer 100 of FIGS. 1-3). The various dies 204 may then be delivered to customers, third party fabricators, etc. In conventional settings, it may be impossible to determine the original location of a particular circuit die 204 on its corresponding IC wafer 100. In embodiments of the disclosure, however, the various circuit dies 204 include the same structure of each circuit die 104 (FIGS. 1-3) of IC wafer 100. Thus, it is possible to select one circuit die 204 for analysis and inspect the location of reference features 110 and identification features 112 in each circuit die. Circuit die 204A, for example, can be matched with circuit die 104A (FIGS. 2-3) by identifying the offset vector as being the sum of vector R in the latitudinal direction and vector S in the longitudinal direction. Circuit die 204B similarly can be matched with circuit die 104B (FIGS. 2-3) by calculating vectors 2R and S therein. Circuit die 204D can also be matched with circuit die 104D (FIG. 3) by calculating vectors 3R and S therein. As noted elsewhere herein, the offset vector between features 110, 112 may correspond to only one circuit die 104 of a particular IC wafer 100. In the case where a particular circuit die 204 is a functional failing device, it is possible to identify a portion of IC wafer 100 where the functional failure originated during fabrication. During implementation, a user and/or other recipient of circuit dies 204 may provide a functional failing circuit die 204 to the original manufacturer of IC wafer 100. The method then allows each failing circuit die 204 to be traced back to the portion of IC wafer 100 where it was originally created. The manufacturer may then adjust one or more tools associated with the portion of IC wafer 100 where circuit die(s) 204 with functional failures originated.

Figure 5:
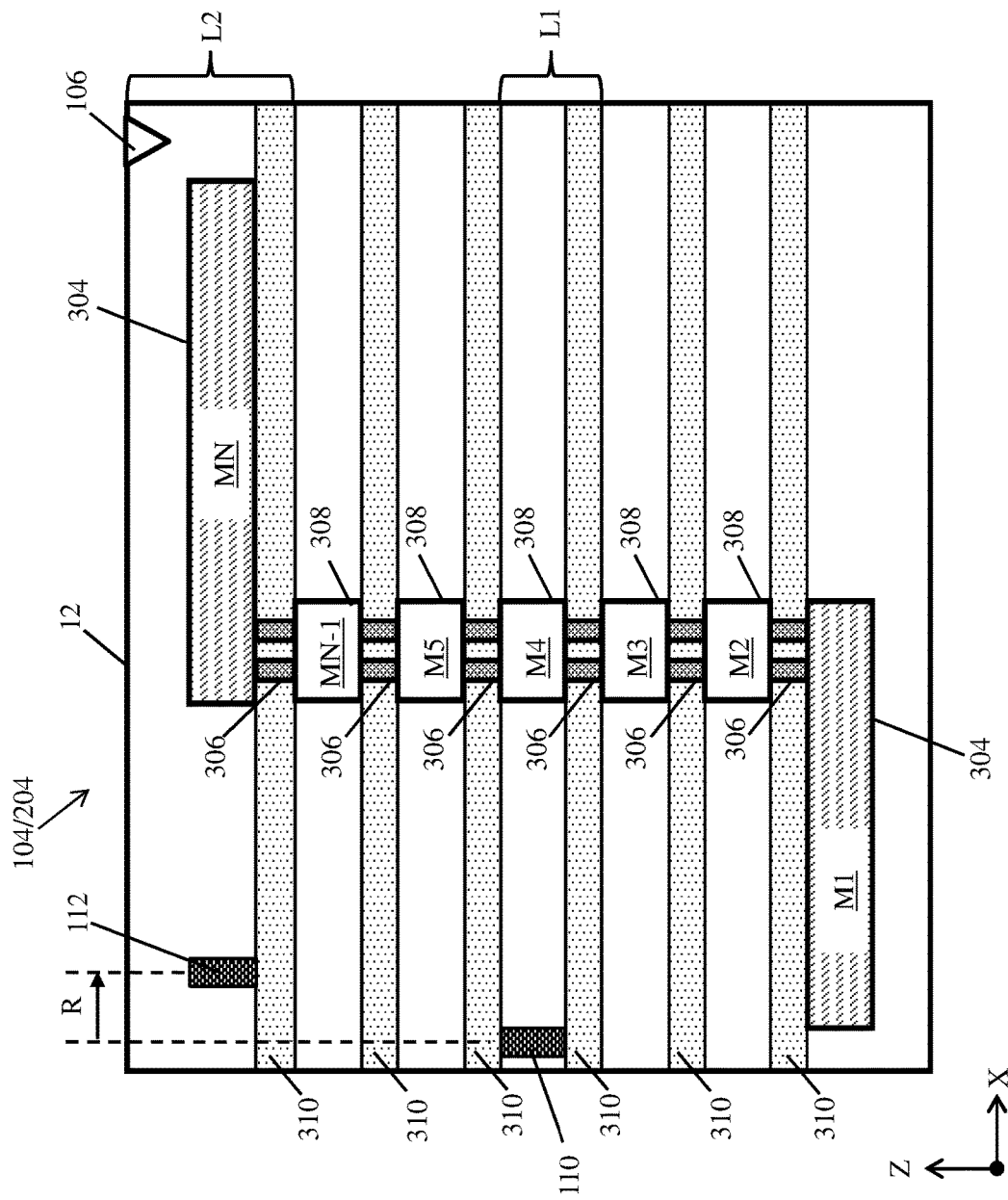
FIG. 5 provides a cross-sectional view in plane X-Z of a plurality of layers in a circuit die according to embodiments of the disclosure.

Turning now to FIG. 5, a cross-sectional view of one circuit die 104 or circuit die 204 is shown to better illustrate the location of reference features 110 and identification features 112. As a result of dicing along scribe lines 106, the portions of circuit die 104 depicted in FIG. 5 may also be present in corresponding circuit dies 204. One scribe line 106 is shown by example in FIG. 5 to illustrate its location in IC wafer(s) 100 (FIGS. 1-3), but it is understood that scribe lines 106 will not appear on circuit dies 204 that have already been diced from IC wafer 100. Each circuit die 104 and/or circuit die 204 may include, e.g., a plurality of metal wires 304, each of which can be composed of any currently known or later-developed electrically conductive material including, e.g., copper (Cu), aluminum (Al), silver (Ag), gold (Au), combinations thereof, etc. Metal wires 304 can be formed and positioned within a layer of electrically insulative or semiconductive material (e.g., a region of semiconductor material or an electrically insulating dielectric material), such that metal wires 304 transmit electricity between other electrically conductive structures in contact therewith. Metal wires 304 positioned within a lowermost terminal metal level M1 can extend in a particular direction (e.g., along axis X). Metal wires 304 positioned within an uppermost terminal metal level MN can similarly extend along axis X in the same direction as metal wire(s) 304 in lowermost terminal metal level M1, or a different direction. Lowermost terminal metal level M1 and uppermost terminal metal level MN can be vertically separated from each other (e.g., along axis "Z" shown in FIG. 5), either as directly adjacent metal levels or with intervening metal and insulator levels positioned therebetween.

Metal wires 304 within different metal levels (e.g., lowermost terminal metal level M1 and uppermost terminal metal level MN) can be electrically connected to each other with vias 306 each extending vertically between lowermost terminal metal level M1 and uppermost terminal metal level MN. Vias 306 can be composed of the same electrically conductive material(s) as each metal wire 304, or can be composed of one or more different conductive materials. Each via 306, in an embodiment, can comprise any standard conductive metal (for example, copper) with a lining material (not shown) thereon, such as tantalum nitride.

Lowermost and uppermost terminal metal levels M1, MN can be separated from one another by one or more intervening metal levels 308 (each labeled, e.g., as M2, M3, M4, M5, MN−1). As suggested by the notations MN and M1, the number of metal levels can vary depending on the chosen implementation and any requirements for back end of line (BEOL) processing. Circuit die 104 and/or circuit die 204 can also include interlayer dielectrics 310 positioned between each intervening metal level 308. Each interlayer dielectric 310 can include one or more electrically insulative substances including, without limitation: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In some embodiments, it is also understood that different interlayer dielectrics 310 can be composed of different materials with correspondingly different dielectric constants. In one embodiment, one or more vias 308 can extend from one metal level to an adjacent metal level, such that metal wire(s) 304 in lowermost terminal metal level M1 can be electrically connected to metal wire(s) 304 in uppermost terminal metal level MN of circuit die 104 or circuit die 204.

In the cross-sectional view of circuit die 104 or circuit die 204, a first layer L1 may be fabricated to include reference feature(s) 110 located near a corresponding metal wire 308 in the same level (e.g., metal level M4 of FIG. 5). Although metal level M4 is shown by example to be level where reference feature(s) 110 is formed within circuit die 104 or circuit die 204, it is understood that reference feature(s) 110 may be formed in any one of the various metal levels M1 through MN. Any of the metal levels M1-MN may be separately identified as first layer L1, and may include reference feature(s) 110 therein. A second layer L2 of circuit die 104 or circuit die 204 may include identification feature(s) 112, e.g., formed on interlayer dielectric 310 of the same level and proximal to metal wire(s) 304 in the same metal level. As shown, second layer L2 with identification feature(s) 112 therein may be uppermost terminal metal level MN. One benefit to forming identification feature(s) 112 in uppermost terminal metal level MN may be an improved ability to detect the location of identification feature(s) 112 in circuit die 104 or circuit die 204. However, it is also understood that second layer L2 may refer to any layer where identification feature(s) 112 appear, e.g., any of the various metal layer M1 through MN in a particular circuit die 104 or circuit die 204. To sense the position of reference feature(s) 110 and/or identification feature(s) located beneath other layers of circuit die 104, any currently known or later-developed sensing instruments (e.g., electromagnetic sensors, thermal sensors, etc.) can be used to determine the location of specific underlying materials.

Figure 6:
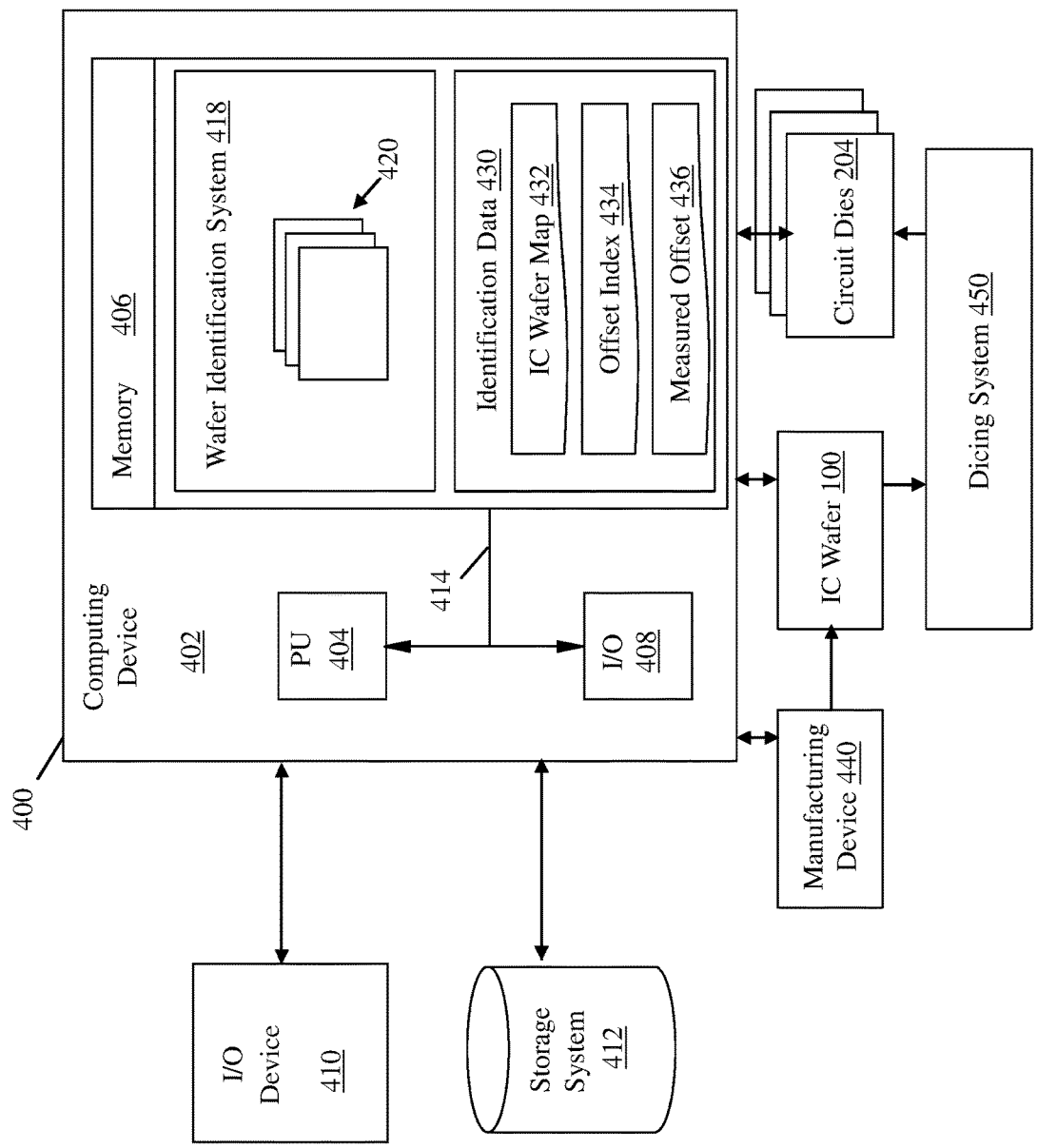
FIG. 6 provides a schematic view of an illustrative environment for implementing methods according to embodiments of the disclosure.
Figure 7:
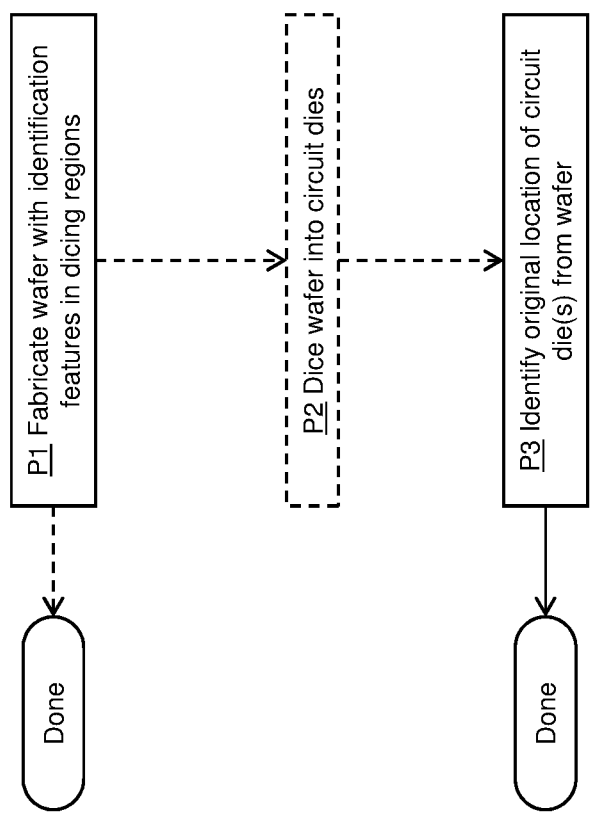
FIG. 7 provides an illustrative flow diagram of methods according to embodiments of the disclosure.

Turning to FIG. 6, process methodologies according to the disclosure may be implemented using an environment 400 having one or more computing devices 402. Computing device 402 and example components thereof may be implemented in various systems and methods according to embodiments of the present disclosure. As discussed herein, computing device 402 can be in communication with IC wafer 100 and/or circuit dies 204 according to embodiments. To this extent, computing device 402 can perform various processes to identify a position on IC wafer 100 where circuit dies 204 originate, after dicing occurs. Although one IC wafer 100 and one plurality of circuit dies 204 are shown for the sake of example, it is understood that environment 400 may be configured to operate on and/or interact with multiple IC wafers 100 or pluralities of circuit dies 204, sequentially and/or simultaneously.

Environment 400 shown to include computing device 402 including a processing unit (PU) 404 (e.g., one or more processors), a memory 406 (e.g., a storage hierarchy), an input/output (I/O) component 408, an I/O device 410 (e.g., one or more I/O interfaces and/or devices), a storage system 412 and a communications pathway 414. In general, PU 404 executes program code, such as a wafer identification system 418 at least partially fixed in memory 406. While executing program code, PU 404 can process data, which can result in reading and/or writing transformed data from/to memory 406 and/or I/O device 408 for further processing. Pathway 414 provides a communications link between each of the components in computing device 402. I/O component 408 can comprise one or more human I/O devices, which enable a human or system user to interact with computing device 402 and/or one or more communications devices to enable user(s) to communicate with computing device 402 using any type of communications link. To this extent, wafer identification system 418 can manage a set of interfaces (e.g., graphical user interface(s), application program interface, etc.) that enable user(s) to interact with wafer identification system 418. Wafer identification system 418 may include a group of modules 420 to perform various functions as discussed herein. Further, wafer identification system 418 can manage (e.g., store, retrieve, create, manipulate, organize, present, etc.) a set of identification data 430 using any solution. Environment 400 may also include, e.g., a manufacturing device 440 in the form of one or more currently known or later developed tools for fabrication of IC wafer(s) 100, and/or a dicing system 450 configured to dice IC wafer 100 into a plurality of circuit dies 206 (e.g., along scribe lines 106 (FIGS. 1-3).

Computing device 402 can comprise one or more computing devices, including specific-purpose computing articles of manufacture (e.g., computing devices) capable of executing program code, such as wafer identification system 418 installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, wafer identification system 418 can be embodied as any combination of system software and/or application software.

Further, wafer identification system 418 can be implemented using a set of modules 420, e.g., a calculator, comparator, a determinator, etc. In this case, each module can enable computing device 402 to perform a set of tasks used by wafer identification system 418, and can be separately developed and/or implemented apart from other portions of wafer identification system 418. One or more modules can display (e.g., via graphics, text, sounds, and/or combinations thereof) a particular user interface on a display component such as a monitor. When fixed in memory 406 of computing device 402 that includes PU 404, each module can be module a substantial portion of a component that implements the functionality. Regardless, it is understood that two or more components, modules and/or systems may share some/all of their respective hardware and/or software. Further, it is understood that some of the functionality discussed herein may not be implemented or additional functionality may be included as part of computing device 402.

As noted herein, wafer identification system 418 may include or otherwise have access to various forms of identification data 430. Identification data 430 may be included within memory 406 as shown in FIG. 6, and in addition or alternatively may be provided within storage system 412 and/or other components within environment 400 or communicatively connected thereto. An IC wafer map 432 of identification data 430 may provide a listing, graphical depiction, etc., of all circuit dies 104 (FIGS. 1-3, 5) in one IC wafer 100. Identification data 430 may also include, e.g., an offset index 434 correlating each circuit die 104 with the corresponding offset vectors for reference feature(s) 110 (FIGS. 1-5) and identification feature(s) 112 for each circuit die 104 in IC wafer 100. As discussed elsewhere herein, identifying circuit die(s) 204 as corresponding to circuit die(s) 104 in one IC wafer may include measuring the offset vector of circuit die(s) 204 under analysis. These measurements may be take the form of measured offset(s) 436 in identification data 430.

When computing device 402 comprises multiple computing devices, each computing device may have only a portion of wafer identification system 418 (e.g., one or more modules) thereon. However, it is understood that computing device 402 and wafer identification system 418 are only representative of various possible equivalent computer systems that may perform a process described herein. To this extent, in other embodiments, the functionality provided by computing device 402 and wafer identification system 418 can be at least partially implemented by one or more computing devices that include any combination of general and/or specific purpose hardware with or without program code. In each embodiment, the hardware and program code, if included, can be created using standard engineering and programming techniques, respectively.

Regardless, when computing device 402 includes multiple computing devices, the computing devices can communicate over any type of communications link. Further, while performing a process described herein, computing device 402 can communicate with one or more other computer systems using any type of communications link. In either case, the communications link can comprise any combination of various types of wired and/or wireless links; comprise any combination of one or more types of networks; and/or use any combination of various types of transmission techniques and protocols.

Figure 8:
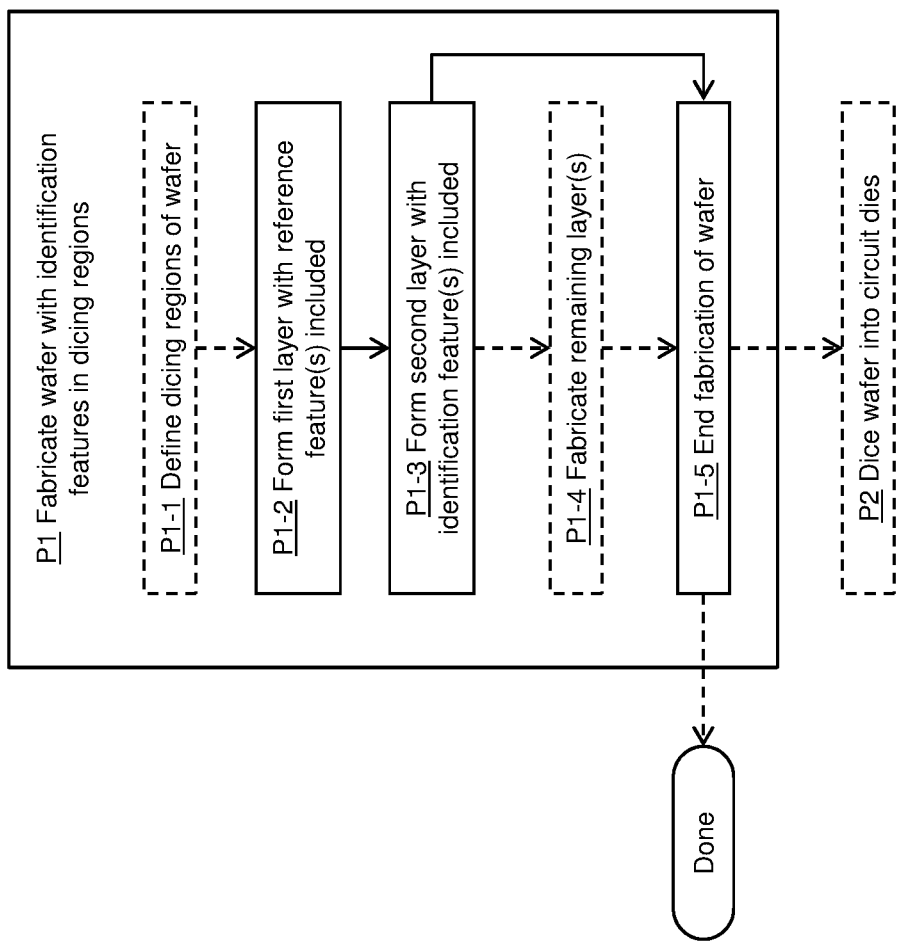
FIG. 8 provides an illustrative flow diagram of a method for manufacturing IC structures according to embodiments of the disclosure.

Referring concurrently to FIGS. 3-7, the disclosure includes various methodologies for manufacturing IC wafers 100 for identification, and/or identifying portions of IC wafer 100 where circuit dies 204 originate. Viewed generally, processes according to the disclosure may include methods for creating IC wafer 100 with identifying structures (e.g., reference features 110 and identification features 112) therein for future analysis, and/or related methodologies for identifying the original location of a circuit die 204 in IC wafer 100 after dicing has completed. At process P1, the disclosure may include fabricating wafer 100 to include one or more reference features 110 in a first layer of each circuit die 104, and one or more identification features 112 in a second layer of each circuit die 104. As noted elsewhere herein, reference feature(s) 110 may have the same separation distance from corresponding scribe lines 106 in each circuit die, while identification feature(s) 112 may have a different offset vector from reference feature(s) 110 in each circuit die 104. In conventional settings, manufacturing device 440 may be configured to create a uniform product design for the functional elements in all circuit dies 104 of IC wafer 100. As noted elsewhere herein, forming IC wafer 100 according to the disclosure includes forming identification features 112 at different locations in each circuit die 104. To form identification features 112 at a different location in each circuit die 104, modules 420 of computing device 402 may automatically adjust the position where identification feature(s) 112 are formed in each circuit die, e.g., by adjusting the position of one or more masks, deposited metals, etc., along a set pattern. Such patterns, e.g., increasing the separation distance of identification feature(s) 112 from associated reference feature(s) 110 in each circuit die 104 by a predetermined multiple, e.g., as shown in FIG. 3 and discussed elsewhere herein. Where identification feature(s) 112 are formed by deposition, the adjusting may be applied to a deposition tool for creating one or more metals in IC wafer 100. In cases where identification feature(s) 112 are formed by combinations of masking, etching, etc., modules 420 of computing device 402 may adjust the position of such components to modify the location of identification feature(s) 112. In all other respects, the fabrication of IC wafer 100 may proceed substantially in accordance with conventional wafer fabrication techniques. Additional sub-processes of process P1 are shown in FIG. 8 and discussed elsewhere herein.

Upon completion of process P1, the method may conclude ("Done") in cases where IC wafer 100 is diced in an independent process. In other cases, the flow may continue to process P2 of using dicing system 450 to dice IC wafer 100 into multiple circuit dies 204. The dicing of IC wafer 100 may proceed substantially in accordance with conventional wafer dicing, despite the presence of reference features 110 and identification features 112 in each circuit die 104. More specifically, reference features 110 and identification features 112 may not be located near or along scribe lines 106, and thus will not affect the dicing of IC wafer 100 into circuit dies 204.

Figure 9:
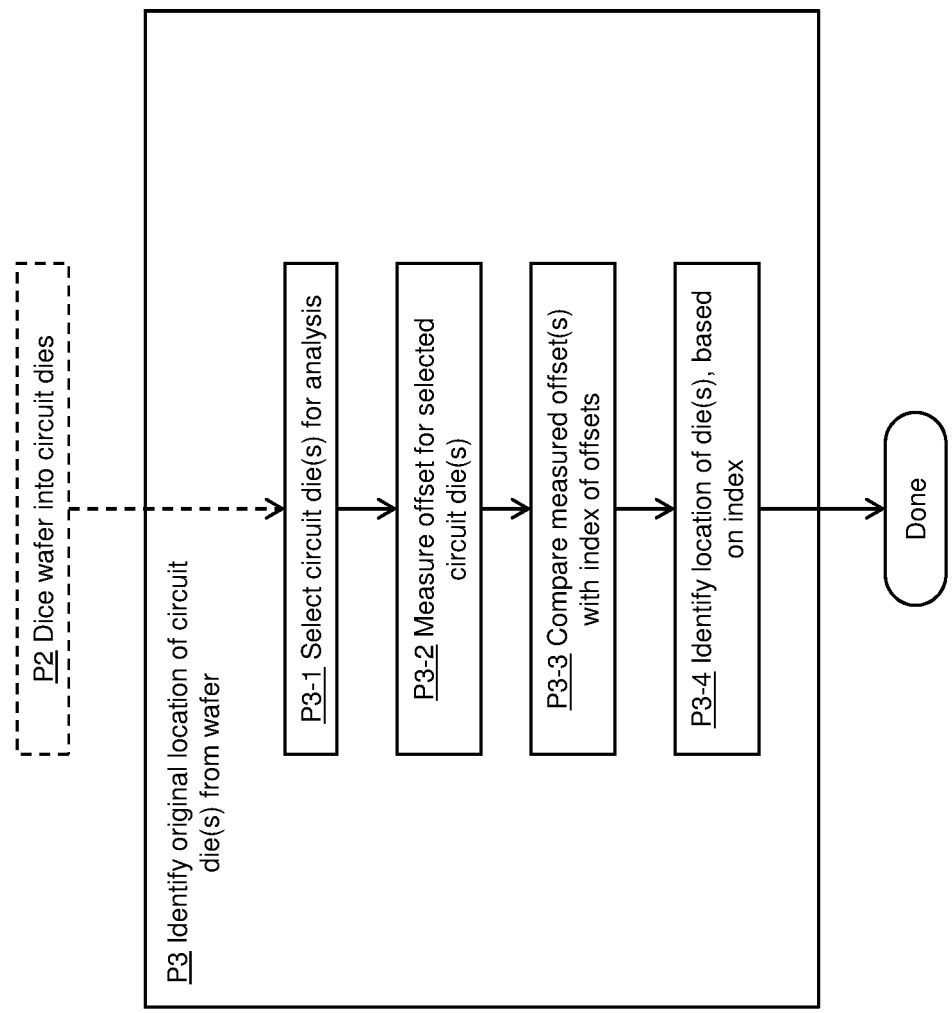
FIG. 9 provides an illustrative flow diagram of a method for identifying circuit dies according to embodiments of the disclosure.

Whether IC wafer 100 is diced into circuit dies 204 as part of a single process for identifying circuit dies, or a preliminary operation independent from identifying each circuit die, the disclosure may include process P3 of identifying the original location of one or more circuit dies 204 on IC wafer 100. Specific techniques, sub-processes, etc., for identifying the original location of circuit die(s) 204 on IC wafer 100 in process P3 are shown in further detail in FIG. 9 and described elsewhere herein. Identifying the original location of each circuit die 204 on IC wafer 100 may include, for example, measuring the offset vector for identification feature(s) 112 on each circuit die 204 and comparing the measured value to offset index 434, and then determining the location based on which offset distance of index 434 matches the measured value. The flow may then conclude ("Done") for the circuit dies 204 being identified.

Referring concurrently to FIGS. 3-6 and 8, an example group of sub-processes for process P1 of fabricating a wafer with reference features 110 and identification features 112 in circuit dies 104 is provided. In a preliminary process P1-1, the disclosure may include defining the various circuit dies 104 of IC wafer 100. Process P1-1 is shown in phantom to emphasize that this process may not be included in all instances of process P1 and/or may be executed by other entities. Process P1-1 may occur, e.g., prior to the fabrication of IC wafer 100 by defining the location of scribe lines 106 in a design for IC wafer 100 and circuit dies 204. Scribe lines 106 may also be formed directly on IC wafer 100 after the fabrication of IC wafer 100 and prior to dicing.

Regardless of how circuit dies 104 are defined, process P1-2 according to the disclosure may include forming first layer L1 (e.g., any predetermined metal level such as one or more of metal levels M1-MN of FIG. 5) with reference feature(s) 110 therein. As noted previously, reference feature(s) 110 may have a uniform separation distance from corresponding sets of scribe lines 106 in each circuit die 104 of IC wafer 100. Continued fabrication of IC wafer 100 can then proceed to process P1-3 of forming second layer L2 (e.g., any other predetermined metal level such as one or more of metal levels M1-MN of FIG. 5) with identification feature(s) 112 therein.

After completing processes P1-2 and P1-3, continued fabrication of IC wafer 100 may optionally include fabricating all other layers where features 110, 112 do not appear. In alternative implementations, the various remaining layers may be formed before the layers designated as being first layer L1 and second layer L2, and/or between the forming of first layer L1 and second layer L2. In still further embodiments (e.g., forming second layer L2 as lowermost terminal metal level M1), second layer L2 may be formed before first layer L1. In any case, the method may include ending the fabrication of IC layer 100 in process P1-5, e.g., after forming the functional components and features 110, 112 which constitute each circuit die 104 of IC wafer 100. Upon completing the fabrication of IC wafer 100, modules 420 of wafer identification system 418 can store IC wafer map(s) 432 for future use as identification data 430. The generating and/or storing of IC wafer map(s) 432 for subsequent use may also occur as part of one of processes P1-1 through P1-4, or a separate operation. In cases where another entity is responsible for identifying circuit dies 204, the flow may conclude ("Done") after process P1-5. In other situations, the method may continue to process P2 of dicing IC wafer 100 into circuit dies 204 to be identified.

Referring concurrently to FIGS. 3-6 and 9, embodiments of the disclosure may include one or more sub-processes for identifying the original location of each circuit die 204 on IC wafer 100. In process P3-1, for example, one or more circuit dies 204 (containing, e.g., one or more functional failures such as manufacturing defects or anomalies) may be selected for analysis based on examination and/or testing. At process P3-2, a user may examine circuit die(s) 204 under analysis (e.g., manually or automatically with the assistance of software, tools, etc.) to measure the offset vector between identification feature(s) 112 and reference feature(s) 110 located on circuit die(s) 204 under analysis. According to an example, an electromagnetic imaging tool may detect the position of one reference feature 110 and one identification feature 112 extending in parallel with the reference feature 110. The imaging tool may then, e.g., with the aid of modules 420, measure, calculate, etc., the separation distance between identification feature 112 and reference feature 110 along one axis. The imaging tool may subsequently, or concurrently, detect the position of other reference features 110 with different orientations and identification features 112 which share the different orientation, to calculate a separation distance between such features 110, 112 along a different axis. The various differences in position for each pair of features 110, 112 can then be combined with each other to yield an offset vector for one circuit die 204 under analysis. As noted elsewhere herein, the offset vector may indicate a separation distance between identification feature(s) 112 and reference feature(s) 110, including both an amount of separation and a separation orientation (e.g., latitudinal or longitudinal separation) between features 110, 112 on circuit die(s) 204. The measured offset vector(s) for each circuit die 204 may be stored, e.g., in memory 406, as measured offset(s) 436 in identification data 430.

Further processes may include using measured offset(s) 436 and other forms of identification data 430 to determine a particular circuit die 104 from which circuit die 204 was created. At process P3-3, the method may include comparing measured offset(s) 436 for circuit dies 204 with known offset vectors in offset index 434. More specifically, comparator modules 420 of wafer identification system 418 can match one or more measured offset(s) 436 with their corresponding values in offset index 434. To account for errors in measurement and/or computation, a calculator of modules 420 may apply one or more tolerance thresholds in the comparison and/or find a best fit match between measured offset(s) 436 and one or more offset vectors in offset index 434. In any case, process P3-3 may pair each measured offset 436 to a corresponding offset vector in offset index 434, e.g., by identifying offset vectors within a margin of error for the measured offsets 436 for a particular IC die 204 under analysis. Continuing to process P4-4, the method may include identifying the original location of each circuit die 204 on IC wafer 100. According to an embodiment, IC wafer map(s) 432 of identification data 430 may include corresponding offset vectors for circuit die 104 of IC wafer 100.

This formatting may allow each measured offset 436 previously matched with an offset vector in offset index 434 to automatically be matched with a particular circuit die 104. At this point, modules 420 can communicate (e.g., via I/O device 410) which circuit die(s) 104 of IC wafer 100 originated circuit die(s) 204. In cases where a particular anomaly detected on one circuit die 204, a portion of IC wafer 100 where circuit die 204 originated can be identified as originating the functional failure of a device. The manufacturing tools, design, and/or other components associated with such portions of circuit die 204 may then be modified to correct errors, compensate for unanticipated operating characteristics, etc. Subsequently, the process may end ("Done") with respect to the particular circuit die(s) 204 under analysis. It is again noted that processes P1 and P3 may each take the form of an independent methodology, process, etc., to be implemented by independent entities, or may be implemented together with process P2 as portions of a single, unified process.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure having a plurality of circuit dies each bounded by a set of scribe lines, the IC structure comprising:
  a plurality of reference features each respectively positioned in a first layer of one of the plurality of circuit dies, wherein the plurality of reference features of the one of the plurality of circuit dies include a first reference line extending along a first axis of the IC structure and a second reference line extending along a second axis orthogonal to the first axis of the IC structure, and a plurality of identification features each positioned in a second, different layer of the one of the plurality of circuit dies, the plurality of identification features of the one of the plurality of circuit dies having an offset vector indicative of a positional difference between the identification features for the circuit dies and the reference features for the one of the plurality of circuit dies, wherein one or both of the first reference line and the second reference line of each one of the plurality of circuit dies is equidistant from a respective one of the set of scribe lines for each circuit die of the plurality of circuit dies.

2. The IC structure of claim 1, wherein the plurality of reference features and the plurality of identification features of each circuit die are included within a functional region of the respective circuit die.

3. The IC structure of claim 1, wherein the offset vector for each circuit die of the IC structure along a shared axis has a same offset orientation.

4. The IC structure of claim 1, wherein one or both of the plurality of reference features and the plurality of identification features comprise one of a metal wire or an insulator.

5. The IC structure of claim 1, wherein an aligned row of circuit dies in the IC structure includes a first circuit die having a first offset vector, and a second circuit die having a second offset vector, wherein an offset distance for the identification features in the second circuit die is twice the offset distance for the identification features in the first circuit die.

6. The IC structure of claim 5, wherein the aligned row of circuit dies in the IC structure further includes a third circuit die having a third offset vector, wherein an offset distance for the identification features in the third circuit die is three times the offset distance for the identification features in the first circuit die.

7. The IC structure of claim 1, wherein the plurality of identification features include two identification lines, each parallel to a respective one of the first and the second reference lines of the plurality of reference features.

* * * * *